(12) United States Patent
Réblewski

(10) Patent No.: US 7,275,196 B2
(45) Date of Patent: Sep. 25, 2007

(54) RUNTIME RECONFIGURATION OF RECONFIGURABLE CIRCUITS

(75) Inventor: Frédéric Réblewski, Paris (FR)

(73) Assignee: M2000 S.A., Bievres (FR)

( * ) Notice: Subject to any disclaimer, the term of this patent is extended or adjusted under 35 U.S.C. 154(b) by 119 days.

(21) Appl. No.: 11/285,988

(22) Filed: Nov. 23, 2005

(65) Prior Publication Data

US 2007/0118783 A1    May 24, 2007

(51) Int. Cl.
*G01R 31/28*    (2006.01)
*G11C 29/00*    (2006.01)
*G06F 11/00*    (2006.01)

(52) U.S. Cl. ................. 714/733; 714/718; 714/710; 714/3; 714/5

(58) Field of Classification Search .................. None
See application file for complete search history.

(56) References Cited

U.S. PATENT DOCUMENTS

| | | | |
|---|---|---|---|
| 4,020,469 A | 4/1977 | Manning | |
| 4,642,487 A | 2/1987 | Carter | |
| 4,700,187 A | 10/1987 | Furtek | |
| 4,870,302 A | 9/1989 | Freeman | |
| 4,918,440 A | 4/1990 | Furtek | |
| 5,208,491 A | 5/1993 | Ebeling et al. | |
| RE34,363 E | 8/1993 | Freeman | |
| 5,255,203 A | 10/1993 | Agrawal et al. | |
| 5,260,610 A | 11/1993 | Pedersen et al. | |
| 5,396,126 A | 3/1995 | Britton et al. | |
| 5,455,525 A | 10/1995 | Ho et al. | |
| 5,457,410 A | 10/1995 | Ting | |
| 5,519,629 A | 5/1996 | Snider | |
| 5,574,388 A | 11/1996 | Barbier et al. | |
| 5,594,363 A | 1/1997 | Freeman et al. | |
| 5,640,327 A | 6/1997 | Ting | |
| 5,648,911 A | 7/1997 | Grodstein et al. | |
| 5,742,181 A | 4/1998 | Rush | |
| 5,796,268 A | 8/1998 | Kaplinsky | |
| 5,825,203 A | 10/1998 | Kusunoki et al. | |
| 5,939,930 A | 8/1999 | Young | |
| 6,073,258 A * | 6/2000 | Wheater ..................... 714/718 |
| 6,088,526 A | 7/2000 | Ting et al. | |
| 6,137,308 A | 10/2000 | Nayak | |
| 6,204,688 B1 | 3/2001 | Cliff et al. | |
| 6,215,326 B1 | 4/2001 | Jefferson et al. | |
| 6,218,859 B1 | 4/2001 | Pedersen et al. | |
| 6,259,272 B1 | 7/2001 | Cliff et al. | |
| 6,289,494 B1 | 9/2001 | Sample | |
| 6,294,928 B1 | 9/2001 | Lytle et al. | |
| 2002/0113619 A1 | 8/2002 | Wong | |

(Continued)

FOREIGN PATENT DOCUMENTS

FR    2 660 510 A1    10/1991

OTHER PUBLICATIONS

Xilinx, Inc. "Virtex 2.5 V Filed Programmable Gate Arrays, Product Specification DS003-2 (v2.6)" Jul. 19, 2001.

(Continued)

*Primary Examiner*—Christine T. Tu
(74) *Attorney, Agent, or Firm*—Schwabe Williamson & Wyatt

(57) ABSTRACT

A reconfigurable circuit having primary function blocks with runtime built-in self-test (BIST) circuitry, one or more redundant function blocks and runtime reconfiguration logic is described herein.

20 Claims, 5 Drawing Sheets

U.S. PATENT DOCUMENTS

2004/0151017 A1*  8/2004  Kawasaki .................. 365/145
2006/0156130 A1*  7/2006  Huott et al. ................ 714/733

OTHER PUBLICATIONS

Xilinx, Inc. "XC4000E and XC4000X Series Field Programmable Gate Arrays, Product Specification (v1.6)" May 14, 1999.

Xilinx, Inc. "XC3000 Series Field Programmable Gate Arrays (XC2000A/L, XC300A/L)" (v3.1); Nov. 9, 1998.

Amerson, R., et al. "Plasma: An FPGA for Million Gates Systems" FPGA 1996.

Hill, Dwight D., D.R. Cassiday "Preliminary Description of Tabula Rasa, an Electrically Reconfigurable Hardware Engine" IEEE International Conference on Computer Design: VLSI in Computers & Processors (Sep. 1990); pp. 391-395.

Rose, J., et al. "Architecture of Field-Programmable Gate Arrays: The Effect of Logic Block Functionality on Area Efficiency" IEEE Journal of Solid-State Circuits & (Oct. 1990), vol. 25, No. 5, pp. 1217-1225.

Chow, P. et al. "The Design of an SRAM-Based Field-Programmable Gate Array—Part I: Architecture; IEEE Transaction on Very Large Scale Integration (VLSI) Systems" (Jun. 1999), vol. 7, No. 2, pp. 191-197.

Chow, P. et al.; "The Design of an SRAM-Based Field-Programmable Gate Array—Part II: Circuit Design and Layout; IEEE Transaction on Very Large Scale Integration (VLSI) Systems" (Sep. 1999), vol. 7, No. 3, pp. 321-330.

Nordholz P et al: "A defect-tolerant word-oriented static RAM with built-in self-test and self-reconfiguration" Innovative Systems in Silicon, 1996. Proceedings., Eigth Annual IEEE International Conference on Austin, TX, USA Oct. 9-11, 1996, New York, NY, USA, IEEE, US, Oct. 9, 1996, pp. 124-132, XP010199939 ISBN: 0-7803-3639-9 the whole document.

Kumar V V et al: "Fine-grained self-healing hardware for large-scale autonomic systems" Database and Expert Systems Applications, 2003, Proceedings. 14th International Workshop on Sep. 1-5, 2003, Piscataway, NJ, USA, IEEE, Sep. 1, 2003, pp. 707-712, XP010658255 ISBN: 0-7695-1993-8 the whole document.

Shyue-Kung Lu et al: "Built-in self-test and repair (BISTR) techniques for embedded RAMs" Memory Technology, Design and Testing, 2004. Records of the 2004 International Workshop on San Jose, CA, USA, Aug. 9-10, 2004, Piscataway, NJ, USA, IEEE, Aug. 9, 2004, pp. 60-64, XP01078729 ISBN: 0-7695-2193-2 the whole document.

* cited by examiner

RUNTIME RECONFIGURATION OF RECONFIGURABLE CIRCUITS

TECHNICAL FIELD

Embodiments of the present invention relate to the field of reconfigurable circuits; in particular, to a reconfigurable integrated circuit having a plurality of primary function blocks and redundant function blocks, with self-test logic in each function block, and related applications.

BACKGROUND

Manufacturing yield and pre-mature partial operational failure are persistent problems in integrated circuit production. Built-in self-test (BIST) logic is often utilized to facilitate the testing of circuits during fabrication and/or production to identify defective circuits. Additionally, many circuit designers include redundant circuitry within the circuit in an effort to improve overall yield.

Currently, one technique for addressing various yield problems includes using the BIST logic to detect some defective but replaceable logic during the manufacturing and fabrication process and laser trimming or some other permanent modification process to bypass the defective elements. For example, with laser trimming, after the circuits are tested, a laser cuts some connections in such a way that identified defective elements are bypassed. A laser may also be used to activate available redundant logic during the permanent modification production process.

Yet another technique used to address yield problems due to pre-mature partial failures is a burn-in process that artificially ages the components being tested to eliminate those circuits in the components that experience early failures. If, after burn-in is completed, the BIST logic detects some defective but replaceable logic, permanent modification processes as previously described may be used to bypass and/or replace the defective circuitry prior to distribution.

Unfortunately, these modification techniques incur a significant cost during the fabrication and production process while providing no performance guarantee for the future. Moreover, manufacturing and production testing as previously described neither detects intermittent errors, nor repairs any such undetected errors. Additionally, operational circuit errors that develop after production are not easily repaired using production based techniques, such as laser trimming or other similar permanent modification methods.

BRIEF DESCRIPTION OF THE DRAWINGS

The present invention will be described by way of exemplary embodiments, but not limitations, illustrated in the accompanying drawings in which like references denote similar elements, and in which.

DETAILED DESCRIPTION

In the following detailed description, reference is made to the accompanying drawings which form a part hereof wherein like numerals designate like parts throughout, and in which are shown, by way of illustration, specific embodiments in which the invention may be practiced. It is to be understood that other embodiments may be utilized and structural or logical changes may be made without departing from the scope of the present invention. Therefore, the following detailed description is not to be taken in a limiting sense, and the scope of the present invention is defined by the appended claims and their equivalents.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification do not necessarily all refer to the same embodiment, but it may. The phrase "A/B" means "A or B". The phrase "A and/or B" means "(A), (B), or (A and B)". The phrase "at least one of A, B and C" means "(A), (B), (C), (A and B), (A and C), (B and C) or (A, B and C)". The phrase "(A) B" means "(A B) or (B)", that is "A" is optional.

A fuse ROM is a collection of fuses that are either intact or blown out. Whether each one of the fuses is blown out or not provides one bit of information that can be easily store on any integrated circuit without requiring the need of any special process. Such information is persistent even across power down cycles.

Built In Self Test (BIST) logic is used in conjunction with redundant circuitry to improve the performance, reliability, and lifetime or the availability of the circuit that employs the combination. In one embodiment, the BIST logic is executed automatically at power up or upon an explicit user instruction to detect and/or to invalidate any defective logic. The defective logic either being identified, isolated, and stored until the next run of the BIST logic or corrected through a permanent configuration alteration. The redundant circuitry being either configurable or identical to the defective portions of the circuitry.

Figure 1:
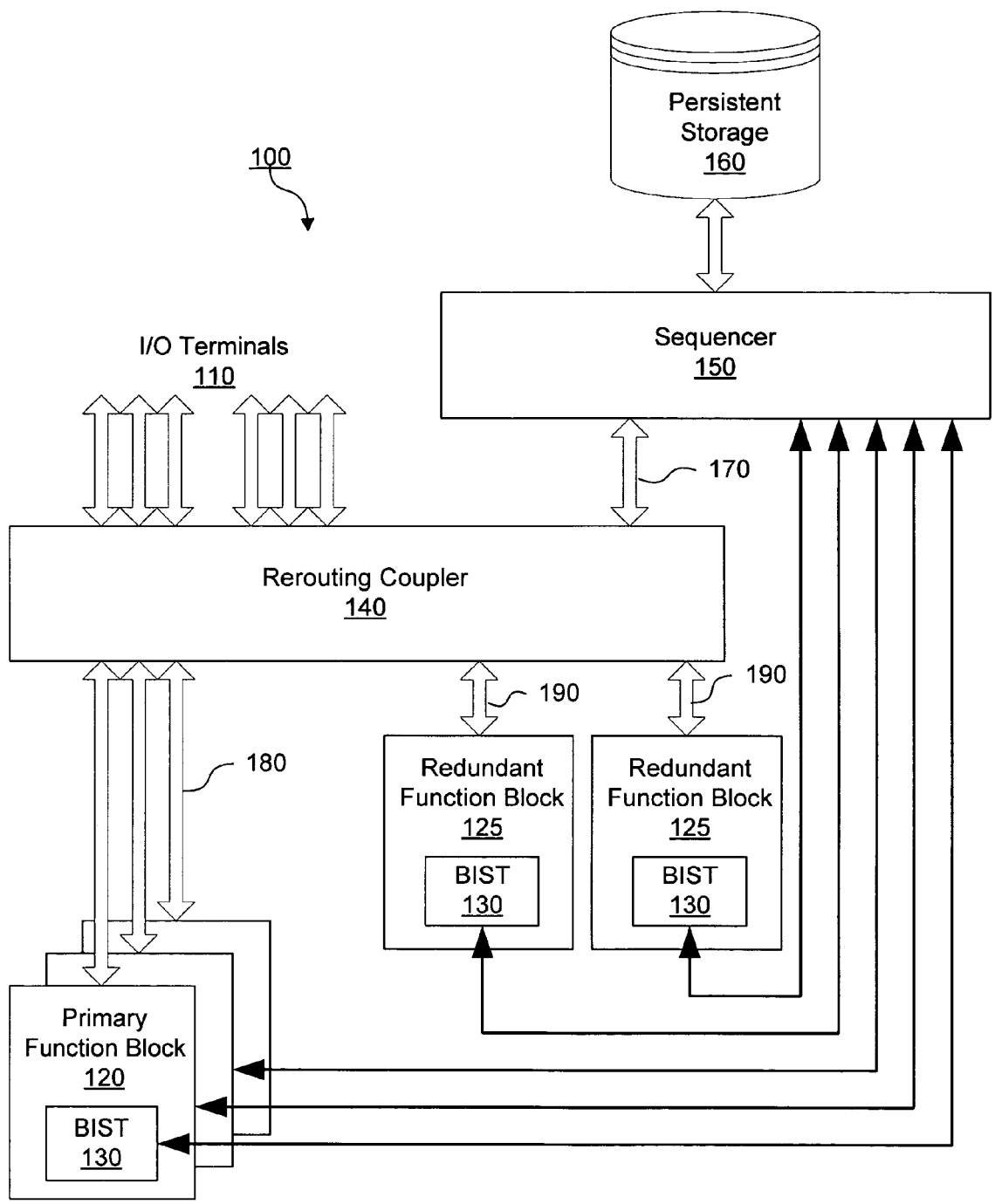
FIG. 1 illustrates a block diagram of a portion of a reconfigurable circuit, employing one or more redundant function blocks and a runtime recovery mechanism, in accordance with various embodiments of the present invention.

Referring now to FIG. 1, wherein a block diagram of a portion of a reconfigurable circuit employing one or more redundant function blocks and a runtime recovery mechanism, in accordance with various embodiments, is shown. As illustrated, for the embodiments, reconfigurable circuit 100 includes Input/Output (I/O) terminals 110, one or more primary function blocks 120, and one or more reconfigurable redundant function blocks 125, coupled to each other as shown. Additionally, for the illustrated embodiments, reconfigurable circuit 100 includes rerouting coupler 140 and sequencer 150 coupled to each other and function blocks 120 and 125 as shown. The illustrated embodiments also include persistent storage 160 coupled to the earlier enumerated elements as shown. In alternate embodiments, the present invention may be practiced without one or more of the above enumerated elements, e.g., persistent storage 160.

In various embodiments, the portion of the reconfigurable circuit illustrated in FIG. 1 is referred to as a macro cluster of reconfigurable circuit 100. A reconfigurable circuit incorporated with the teachings of the present invention may have one or more of the illustrated macro clusters, coupled to each other, with each macro cluster having a number of primary function blocks 120, redundant function blocks 125 (hereinafter, simply "function blocks", unless particularized), and so forth.

Continuing to refer to FIG. 1, for the embodiments, each function block is adapted to implement a function and includes BIST logic 130 configured to determine whether the function block hosting the BIST logic 130 is defective or not. The function block may have a number of resources that need to be tested prior to each runtime. Examples of such resources include but are not limited to reconfigurable logic, memory, multiplier, and so forth. In one embodiment, at least one of the primary function blocks 120 is a reconfigurable function block reconfigurable to implement different combinational logic. Moreover, in one embodiment, at least one of the primary function blocks 120 is a memory block.

In various embodiments, a redundant function block 125 is configurable to replace a defective primary function block 120 and implement the function of the defective primary function block in place of the primary function block 120, which was found to be defective. The defective function blocks may be identified during run(s) of the BIST logic 130. In various embodiments, each of the redundant function blocks 125 may be selectively coupled with the I/O terminals 110 via rerouting coupler 140. In one embodiment, the redundant function block 125 is configurable to replace any defective one of at least a subset of the primary function blocks 120, and implement the function of the defective primary function block, in place of the defective primary function, the union of the subset of the primary function blocks that each redundant function block can replace being the whole set of primary function blocks. In one embodiment, the redundant function block 125 is configurable as at least one of a reconfigurable function block, a memory block, a multiplier block, and so forth.

For the illustrated embodiments, the rerouting coupler 140 selectively communicates modified I/O 180 with the primary function blocks 120 and generated I/O 190 with the redundant function blocks 125. The rerouting coupler 140 coupling the function blocks (primary and redundant) with the terminals 110, and configurable to reroute I/O and internal signals propagating from one function block to at least one other function block. Exemplary embodiments where the replacement of a primary function block 120 by a redundant function block 125 may be facilitated by rerouting coupler 140 include when the function blocks are either homogeneous or the function blocks are heterogeneous, but the redundant function block implements a superset of the functions.

Modified I/O 180 may be data exchanged at the terminals 110 or a representative form thereof that is often intended for at least one of the primary function blocks 120 and may also include I/O necessary to configure and/or operate the intended primary function block 120. In contrast, generated I/O 190 also includes data exchanged at the terminals 110 or a representative form thereof, however; the generated I/O 190 may also include I/O necessary to configure and/or operate the redundant function block 125 as the primary function blocks 120 for which the I/O was originally intended. Thus, the use of modified I/O 180 and generated I/O 190 enable the transparent exchange of I/O at the terminals 110 with external applications, so that the corresponding substitution of one of the one or more redundant function blocks, e.g., redundant function block 125, for a defective one of the remaining primary function blocks 120 is inconsequential to the circuit operation.

For the illustrated embodiments, the sequencer 150 is coupled to the primary and redundant function blocks, and is adapted to manage the BIST logic 130 inside the function blocks. More specifically, the sequencer 150 is configured to determine one or more activation periods and/or amount of time to run the BIST logic 130 inside the respective function blocks. The sequencer 150, in one embodiment, may also be adapted to start an auto-diagnostic and repair cycle responsive to a signal received from a source external to the circuit. In one embodiment, the sequencer 150 is adapted to start an auto-diagnostic and repair cycle in response to the application of power individually to the macro block and/or the entire redundant circuit. For example, the auto-diagnostic and repair cycle could be activated upon start up when the circuit is first turned on.

In the illustrated embodiments, the sequencer 150 is also configured to receive results of the BIST logic run(s). In one embodiment, the sequencer 150 is further configured to determine, at the end of the BIST logic run(s), which primary function block 120, if any, is to be replaced by a redundant function block 125, including which redundant function block or blocks are to be used. In at least one embodiment, the sequencer 150 is further configured to provide reconfiguration information to the rerouting coupler 140 to reroute the I/O and/or I/O signals to assist in effectuating the replacement of the primary function block(s) 120 that are defective, if any, by the redundant function block(s) 125.

As described earlier, the illustrated embodiments of reconfigurable circuit 100 also includes persistent storage 160 coupled with the sequencer 150. For the embodiments, persistent storage 160 is configured to persistently store an identification of one or more defective primary function blocks, if any. One aspect of this configuration is that a list of function blocks exhibiting intermittent errors may be maintained by the persistent storage 160 to prevent future use of the unreliable function block(s). Persistent storage 160 as referred to herein includes, but is not limited to, fuse ROM, which in one embodiment is memory located on chip configured to write data that is persistent across power down.

The persistent storage 160 may be configured to store identification of one or more defective primary or redundant function blocks which were previously identified during the production test and placed in the persistent storage location of the circuit and/or during post-distribution BIST or operational processes. In one embodiment, the sequencer of the circuit considers a function block identified in the persistent storage defective independent of the actual results of the operating of the BIST of the identified function block.

Figure 2:
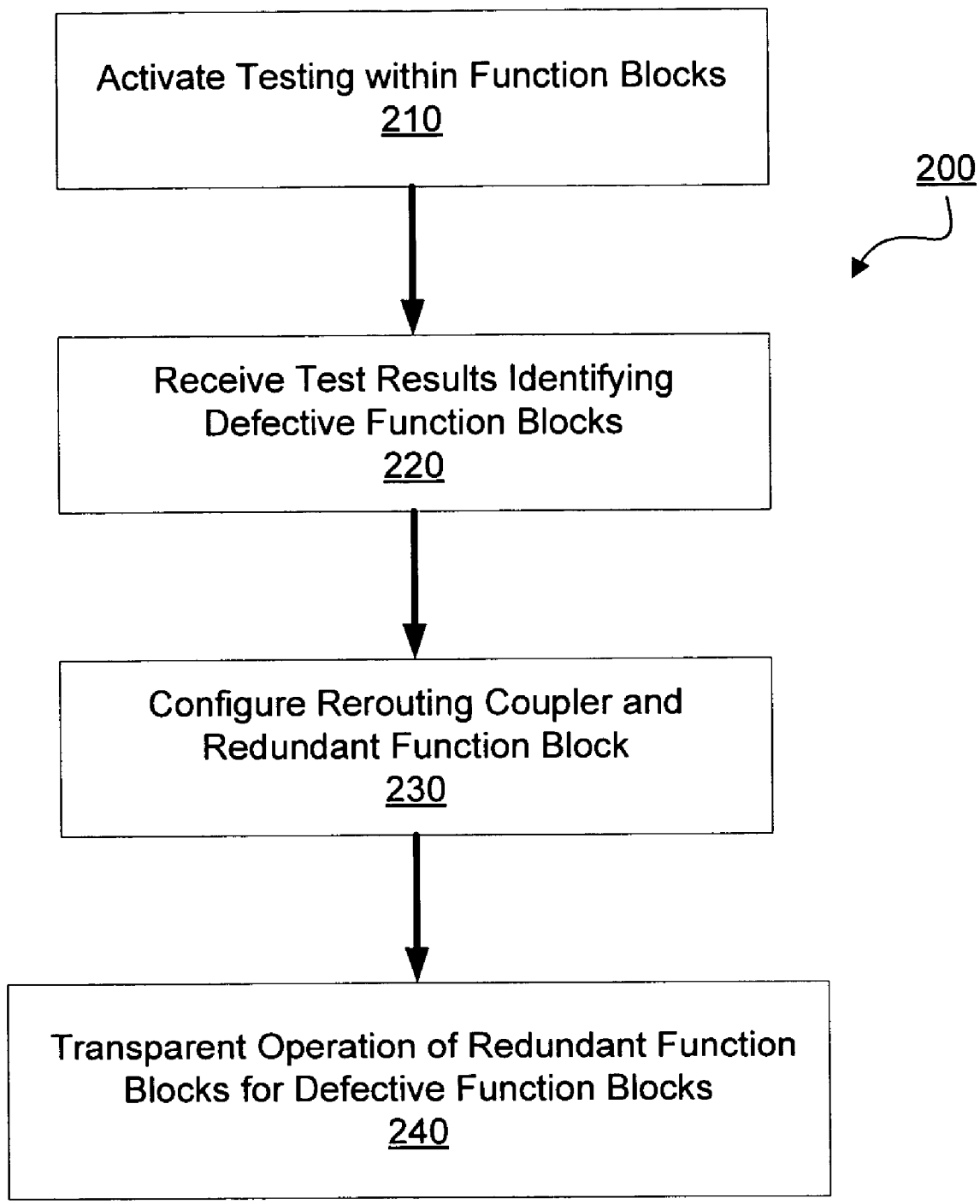
FIG. 2 illustrates a flowchart view of a portion of the operations of the sequencer as presented in FIG. 1 in further detail, in accordance with various embodiments.
Figure 4:
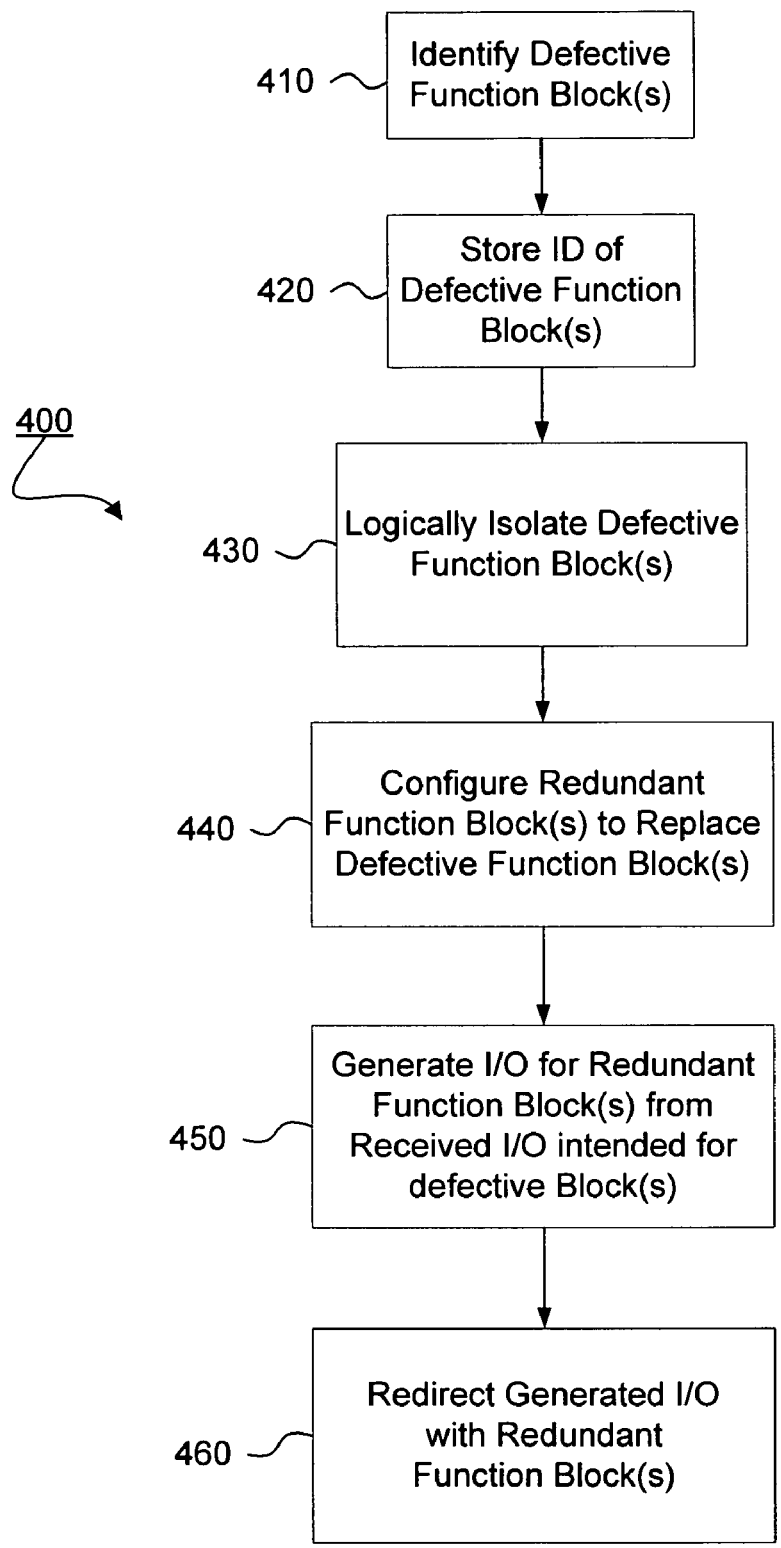
FIG. 4 illustrates a flowchart view of a method of operation for runtime recovery of intermittent errors, in accordance with various embodiments.
Figure 5:
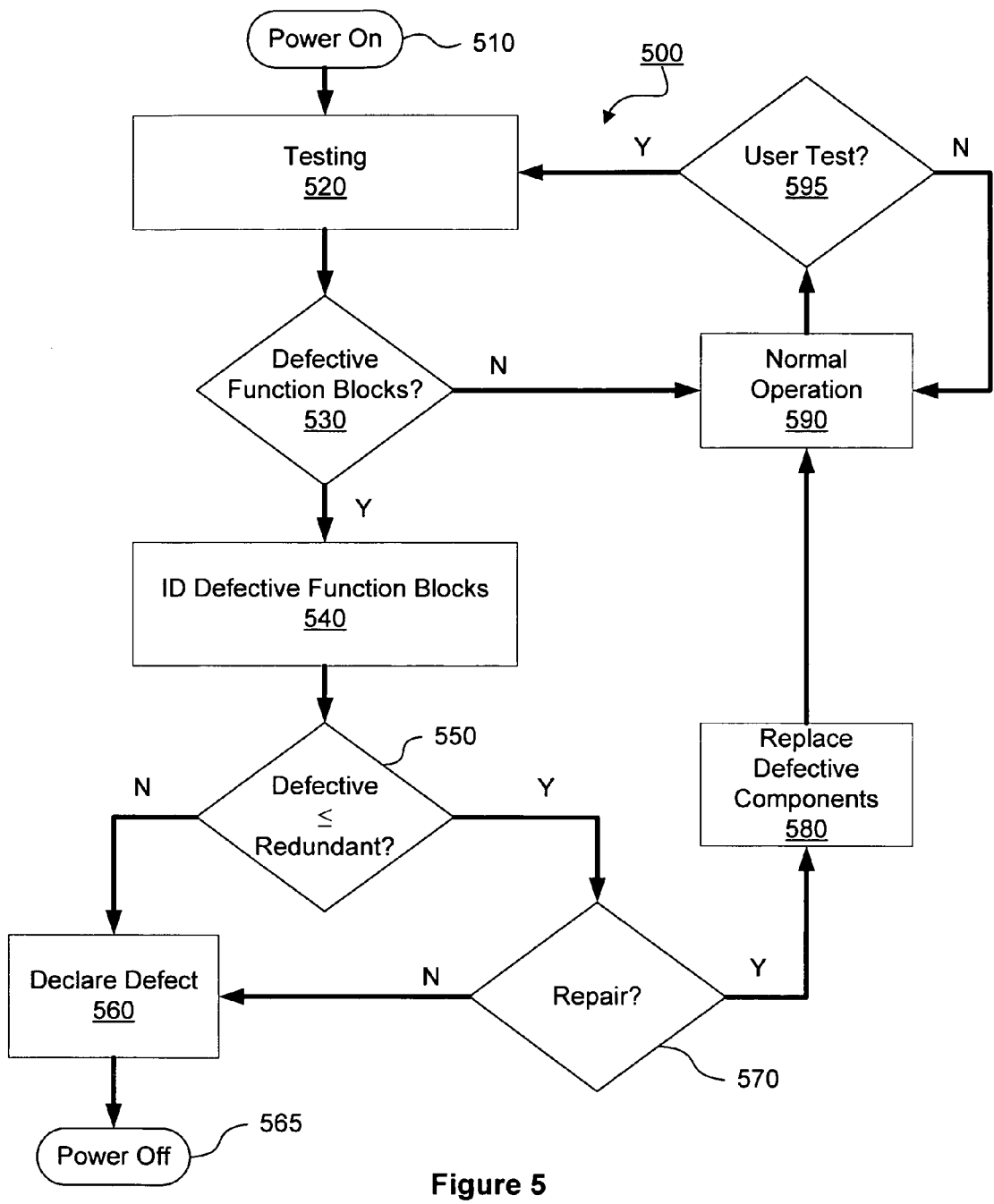
FIG. 5 illustrates a flowchart view of a method of operation, according to various embodiments.

Turning now to FIGS. 2, 4, and 5, wherein various methods of operation of the redundant circuit of FIG. 1, in accordance with various embodiments, are illustrated.

Referring now to FIG. 2, wherein a portion of the operations of sequencer 150, in accordance with various embodiments, is illustrated. Collectively, these operations shall be referred to as operational method/process 200.

For the embodiments, each time (after production/distribution) the circuit is supplied with power and/or upon an explicit external request, sequencer 150 activates testing, such as a pre-operation test, within each of the function blocks in block 210. Upon activation, the BIST logic associated with each function block tests the respective function block for accuracy and dependability. Upon identifying potential defective function blocks (which may be defined in accordance with any number of application dependent manner), the BIST logic in each function block sends the test results to the sequencer 150 in block 220. In one embodiment, where persistent storage 160 is implemented, the post-distribution operational process 200 further includes storing an identification of a defective primary or redundant function block identified post-distribution by the BIST in persistent storage 160 of the reconfigurable circuit (hereinafter, simply "circuit").

In various embodiments, if the testing indicates that the tested circuit exhibits an acceptable ratio of non-defective primary function blocks to non-defective redundant function blocks, then the circuit may be deemed operational. For example, in one embodiment, when the number of defective function blocks is less than the number of redundant function blocks available to replace the defective function blocks, then the ratio of non-defective primary function blocks to non-defective redundant function block is within acceptable operational thresholds. Alternatively, in embodiments where it is not possible to reroute I/O and internal signals of the circuit to facilitate replacement of defective primary function block(s) of the circuit by non-defective redundant function block(s) of the circuit, the circuit may declare portions of the circuit to be defective, the portions including but not being limited to the entire circuit.

In various embodiments, the circuit may declare or indicate functionality according to several levels of availability. For example, in one embodiment, the levels could include "sellable", "good", "operational", and "defective". In this example, "sellable" could indicate that if only N1 function blocks become defective, the circuit would still be operational. A rating of "good" could indicate that should any N2 function blocks (with N2 being an integer less than or equal to N1) become defective, the circuit would still be operational. A rating of "operational" could mean that the circuit has enough non-defective redundant function blocks to replace all defective primary function blocks. The difference between N1 and N2, if any, allows the circuit to have an extended life since N1-N2 function blocks can become defective and the circuit is still declared as "good". The difference between "good" and "operational" allows the circuit to be more fault tolerant and hence undertake various missions where redundancy is useful, such as flying a plane where N2 function blocks are allowed to become defective during the flight without impacting the overall function of the circuit.

If the circuit is not defective, for the embodiments, sequencer 150 configures rerouting coupler 140 and any required non-defective redundant function blocks in block 230. The defective function blocks may be replaced by a number of non-defective redundant function blocks of the circuit by a post-distribution operational process. For example, in one post-distribution operational process, sequencer 150 of the circuit activates a BIST circuit on each of the primary and redundant function blocks of the circuit, and instruct rerouting coupler 140 of the circuit to reroute I/O and internal signals to facilitate the replacement(s), or declare the circuit defective, each time (after distribution) the circuit is supplied with power and/or upon an explicit external request.

In one embodiment, sequencer 150 retrieves stored identification of one or more defective primary or redundant function block(s) previously identified during testing and placed into persistent storage 160. For these embodiments, sequencer 150 of the circuit considers a function block 120/125 identified in persistent storage 160 to be defective, independent of the results of the most recent operating of the BIST of these function blocks. In this manner, function block(s) that may exhibit only intermittent errors are tracked and removed from the circuit nonetheless, through identification based on data retrieved from persistent storage 160 of the circuit.

In various embodiments, only a single type of redundant function block is available to replace defective function blocks. These redundant function blocks are configured to be able to implement any of the functions of the primary function blocks should any of them determined to be defective. In various embodiments, the functions implemented by the primary function blocks in the circuit are all identical, and the primary function blocks and the redundant function blocks are also all identical.

Alternatively, in various embodiments, the set of functions implemented by the primary function blocks includes at least two different functions. Further, at least one of the primary function blocks is different from the other primary function blocks. For some of these embodiments, at least one of the redundant function blocks is multiple functional, and may be configurable to selectively implement, at different points in time, a different one of the at least two functions. Alternatively, the circuit may include multiple redundant function blocks, with different redundant function blocks implementing different functions provided by the primary function blocks.

In various embodiments, each redundant function block is configurable to replace at least a subset of defective primary function blocks, such that the union of available functions created by the redundant function blocks may collectively replace the whole set of primary function blocks.

Once reprogrammed, block 240 provides for the transparent operation of the redundant features. Transparent operation indicates that the external application requesting the function of a specific function block is unaware when a redundant function block is selectively substituted in place of the requested function block. In this manner, the rerouting coupler and/or recovery logic provide the user with the ability to replace defective function blocks without requiring changes to external components interacting with the circuit.

Figure 3:
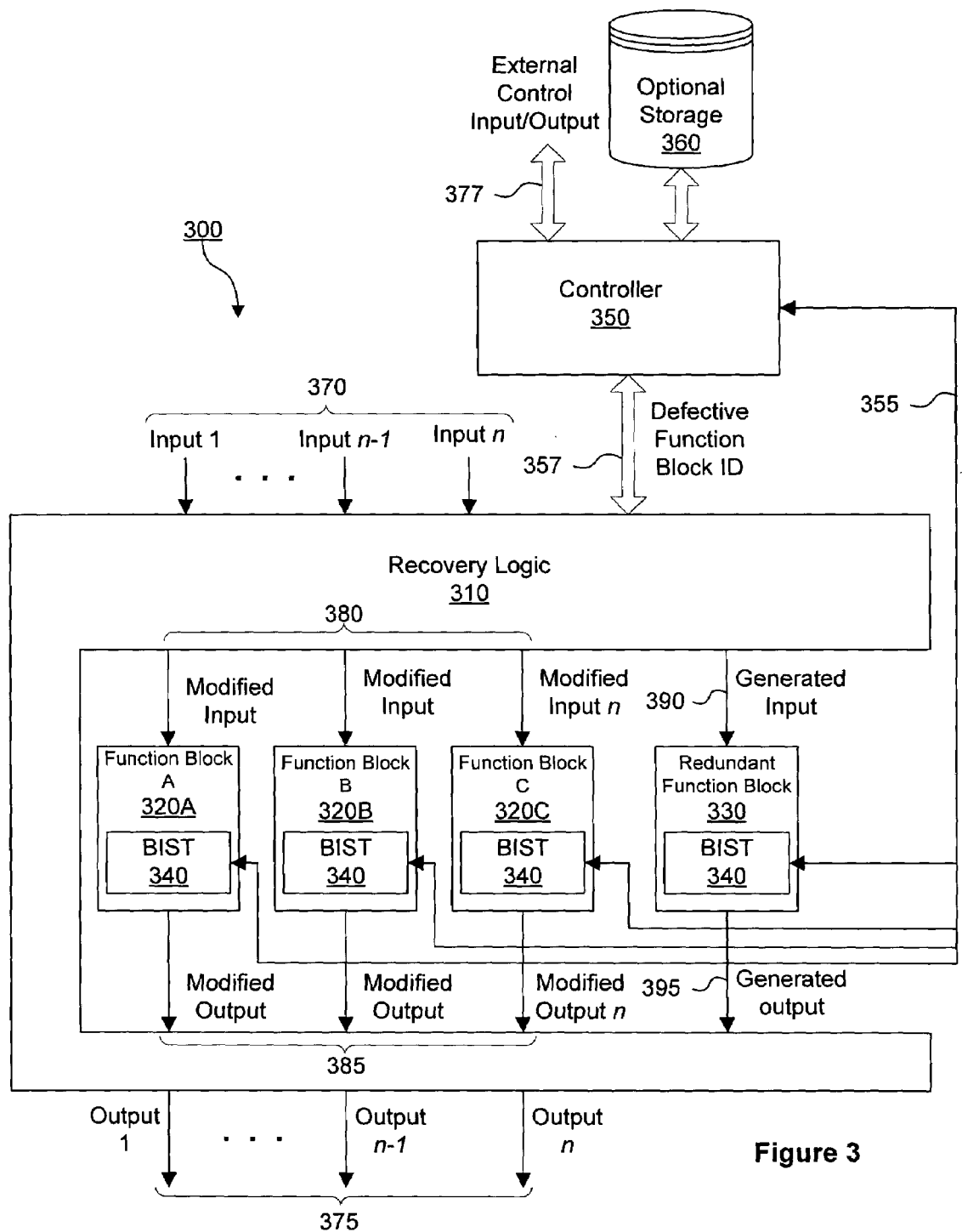
FIG. 3 illustrates a block diagram of a portion of a runtime recovery mechanism, employing external control and generated Input/Output (I/O) to one or more redundant function blocks, in accordance with various embodiments of the present invention.

Referring now to FIG. 3, wherein a reconfigurable circuit 300, in accordance with various alternate embodiments, is illustrated. For these embodiments, reconfigurable circuit 300 includes recovery logic 310, primary function blocks 320, redundant function block 330, controller 350, and optional storage 360, coupled to each other as shown. Each function block 320 and/or 330 includes BIST logic 340 configured to identify and/or determine the present operational status of the function blocks via control lines 355 to controller 350. For the embodiments, reconfigurable circuit 300 also includes Input terminals 370, Output terminals 375, and external control I/O terminals 377, coupled to each other and the earlier enumerated elements as shown. The recovery logic 310 communicates modified input 380 and output 385 with the primary function block(s) 320 and generated Input/Output (I/O) (390 and 395) to redundant function block 330 as illustrated. Modified Input/Output (380 and 385) and generated Input/Output (I/O) (390 and 395) may include data exchanged at Input terminals 370 and/or Output terminals 375 or a representative form thereof. Modified Input/Output (380 and 385) is data often intended for exchange with at least one of the primary function blocks 320 and may also include I/O necessary to configure and/or operate the intended primary function block 320. Generated Input/Output (I/O) (390 and 395) is created to transform data originally intended for exchange with at least one of the primary function blocks 320 into data that may be processed by redundant function block 330.

In various embodiments, where dedicated test circuitry (BIST logic 340) are provided to each of the function blocks 320 and 330 to perform defect detection and identification, controller 350 may be adapted to initiate on its own these defect detection and identification, and configure recovery logic 310 to operate accordingly, as long as the number of defective primary function blocks is smaller than or equal to the number of redundant function blocks available. In various embodiments, controller 350 is adapted to disable circuit 300 and report its disabled condition, if it detected more defective primary function blocks than available redundant function blocks. In various embodiments, the function blocks 320 and 330 may represent macro blocks of a reconfigurable circuit. Upon detection controller 350 is adapted to disable the macro block and report the disabled condition of the macro block to the reconfigurable circuit.

In one embodiment, recovery logic 310 includes a number of reconfigurable interconnect devices, such as crossbar devices, configurable to redirect I/O received on input terminals 370 for a defective function block to a redundant function block. The recovery logic 310 being endowed with logic to enable the redundant function blocks to transparently replace the defective function block. The externalized function blocks may be logical, as opposed to physical. The externalized function blocks, whether logical or physical, may be referred to as primary function blocks.

For the purpose of this invention, the term "transparency" and its related variants refer to the fact that at a minimum, the corresponding substitution of one of the one or more redundant function blocks, e.g., redundant function block 330, for a defective one of the remaining function blocks, e.g., primary function block 320C, is inconsequential to the configuration data stream for configuring the replacing function block 330 as well as the remaining function blocks 320A and 320B to perform a set of targeted function(s). In other words, the configuration data stream does not have to be modified, even though one of the targeted function blocks may be defective.

Continuing to refer to FIG. 3, in various embodiments, reconfigurable circuit 300 has n+1 function blocks 320 and 330 that are homogenous, i.e., function blocks 320 and 330 are identical function blocks. In various ones of these identical embodiments, recovery logic 310 is adapted with logic, such that n of the n+1 function blocks 320 may be externalized for application usage, with the single remaining function block 330 operating as a redundant function block. That is, for these identical embodiments, redundant function block 330 may be employed to transparently replace any defective one of the n externalized function blocks 320.

Before proceeding with further description, it should be noted that while for ease of understanding, the homogenous embodiments are described with the subset of the "leftmost" n function blocks 320 illustrated in FIG. 3 as being externalized for application usage via n input terminals 370 and n output terminals 375, and the "rightmost" function block 330 as the redundant function block, the arrangement is transparent to the application, and known only to recovery logic 310 and/or controller 350. Moreover, in various alternate embodiments, the invention may be practiced with recovery logic 310 and/or controller 350 operating with any n function blocks of function blocks 320 and 330 as externalized for application usage, and the remaining one as the redundant function block.

In various ones of the identical embodiments, recovery logic 310 and/or controller 350 are adapted with logic, such that m of the n+1 function blocks 320 and 330, m and n being both greater than 1, but m being less than n, are externalized for application usage, and the remaining n+1−m function blocks 320 and 330 are operated as the redundant function blocks. That is, for these identical embodiments, any one of the n+1−m redundant function blocks may be employed to replace any defective one of the m externalized function blocks, up to n+1−m externalized function blocks.

In still other identical embodiments, with recovery logic 310 and/or controller 350 endowed with the logic, the m externalized function blocks may be logical, that are mapped to any m of the n+1 physical reconfigurable function blocks. Thus, for these identical embodiments, any one of the n+1 function blocks, up to n+1−m function blocks, may be employed to replace up to n+1−m defective function blocks.

Still referring to FIG. 3, in various embodiments, the n+1 function blocks 320 and 330 are mixed, that is, at least two of function blocks 320 and 330 are dissimilar from each others (hereinafter, mixed embodiments). For these mixed embodiments, in addition to recovery logic 310 and/or controller 350 being endowed with the recovery logic, at least one of the function blocks 320 and 330 is endowed with the union of the resource of the different function blocks, e.g., function block 330 (hereinafter, "super" function block). The other dissimilar function blocks, e.g., function blocks 320, are externalized for application usage. Accordingly, "super" function block 330 may be employed and configured to replace any defective one of the various externalized dissimilar function block.

In various ones of these mixed embodiments, externalized dissimilar function blocks 320 include at least one reconfigurable function block 320A with a multiplier function, and one reconfigurable function block 320B with memory function. For these mixed embodiments, "super" redundant reconfigurable function block 330 includes both the multiplier function and the memory function.

In various ones of these mixed embodiments, the various resources of a "super" reconfigurable function block 330 are adapted to be in a default off state, and complementary resource are additionally provided to enable the resource to be selectively enabled (e.g., by recovery logic 310 and/or controller 350). As a result, for these various mixed embodiments, the programming view of the "super" reconfigurable function block 330 is the same as the reconfigurable function block 320 it replaces, whichever it is. However, in alternate embodiments, the "super" reconfigurable function block 330 and the other mixed reconfigurable function blocks 320 may be allowed to have different programming views. For example, in one embodiment the recovery logic 310 is adapted to map the programming view of the "super" function block to the externalized function block it replaces.

Continuing to refer to FIG. 3, in various embodiments, in addition to n+1 the function blocks 320 and 330, reconfigurable circuit 300 has n modified inputs 380 coupled to function blocks 320 and n modified outputs 385 coupled to function blocks 320, where n is an integer, plus any necessary generated input 390 and output 395 coupled to redundant function block 330. For these embodiments, each of the function blocks 320 and 330, identical or mixed, further includes BIST logic 340 configured to identify and/or determine the present operational status of the function blocks via control line 355 coupled to controller 350. The recovery logic 310 may be configured through the controller 350 programming port 357 to receive inputs from any of the recovery logic 310's input ports 370 and output onto any of the recovery logic 310's modified input ports 380. Similarly, the recovery logic 310 may be configured through the controller 350 programming port 357 to receive outputs from any of the function blocks 320's modified output ports 385 and output onto any of the recovery logic 310's output ports 375.

Still referring to FIG. 3, controller 350 includes external control programming port(s) 377 and optional storage 360. External Control Programming port(s) 377 is (are) provided to facilitate receipt of test/configuration data from an external source to program reconfigurable function blocks 320 and 330, and BIST logic 340 to identify and/or determine the present operational status of the function blocks. Controller 350 is adapted to configure reconfigurable function blocks 320 and 330 in accordance with the received test/configuration data. For the embodiments, recovery logic 310 further includes configuration transaction mapping logic adapted to remap configuration transactions targeted for at least a defective one of the primary function blocks to target a replacement redundant function block and to remap configuration transactions targeted for input and output so that connections to and from at least a defective one of the primary reconfigurable function blocks are rerouted to generated input and output coupled to a replacement redundant function block.

Referring now to FIG. 4, wherein a portion of the operations of recovery logic 310 is illustrated by flowchart in further detail. Collectively, the recovery operations may be referred to as the recovery method/process 400. On activation, recovery logic 310 may be configured to automatically start a diagnostic and/or repair cycle in block 410. In one embodiment, recovery logic 310 activates BIST logic located in each function block (primary and/or redundant) to perform an auto-diagnostic of the respective function block(s). Activation of the diagnostic functions to identify defective function blocks may also be initiated in response to a signal received from a source external to the circuit. In one configuration, recovery logic 310 may identify defective function blocks by retrieving identification information for previously discovered defective function blocks from storage.

Upon identifying defective function blocks in block 410, recovery logic 310 stores identification information, such as a function block ID of defective function blocks in machine-accessible medium at block 420. Exemplary storage include machine accessible medium as illustrated by optional storage 360 in FIG. 3. The storage locations containing the stored ID information may or may not be accessible to external devices.

Alternatively, diagnostics of the function block(s) may be performed independent of the recovery method/process 400, such as during fabrication and/or production and/or previous circuit tests, where the identification information of defective function block(s) from these separate diagnostics are automatically stored in a designated location for subsequent access by recovery logic 310. Accordingly, in at least one embodiment, the recovery method/process 400 may identify defective function blocks through retrieval of previously stored diagnostic results from available machine accessible medium, such as optional storage 360 illustrated in FIG. 3. Generally, however, recovery logic 310 will logically isolate defective function block(s) in block 430 as they are identified in block 410. In one embodiment, the isolation of the defective function block(s) is based on stored defective function block identification information. In this manner, previously detected defective function blocks that exhibit only intermittent errors may also be accounted for.

In block 440, redundant function block(s) are configured to replace defective function block(s) in the circuit. In one embodiment, recovery logic 310 may configure redundant function block(s) in block 440 concurrently with isolating the defective function block(s) in block 430 to minimize the external runtime effects of the substitution.

Depending on the complexity of the circuit, the configuration process for the redundant function block may require different actions. For example, if all of the function blocks (primary and redundant) are identical in the circuit, then configuration merely involves the rerouting of input away from the defective function block to the redundant function block and routing the output of the redundant function block in place of the output of the defective function block.

In more complex embodiments, the redundant function block is programmable/reconfigurable to provide multiple functions and can be programmed to replace a variety of different defective function blocks. In this case configuration is based in part on the stored identification information of the defective function block to be replaced.

Moreover, in block 450, recovery logic 310 generates I/O for the redundant function blocks from received I/O originally intended for the defective function blocks.

Upon isolating the defective function block(s) in block 430, configuring the redundant function block(s) in block 440, and generating I/O in block 450; recovery logic 310 may redirect/route I/O in block 460 to redundant function block(s) to provide transparent operation of the features originally to be provided by the defective function block(s). Transparent operation indicates that external applications requesting function(s) of a specific defective function block are unaware when a redundant function block is selectively substituted in place of the requested defective function block.

Referring now to FIG. 5, a method of operation, in accordance with various embodiments of the present invention, is illustrated. Collectively, the recovery operations may be referred to as the operational method/process 500. As shown, for the embodiments, after the power on state 510, testing is initiated in block 520, e.g., by a sequencer or a controller of a reconfigurable circuit 100/300. In query block 530, whether there are any defective function blocks in the circuit being tested may be determined, e.g., by diagnostic and/or BIST logic via the sequencer/controller. If no defects are detected, the reconfigurable circuit may be enabled to continue normal operation in block 590, e.g., by the sequencer/controller, until a user initiated test is detected in query block 595. If defects are found, then in block 540, the defective function blocks may be identified, e.g., by the sequencer/controller. This identification process may include storing information about the defective function block in persistent storage for future use by the circuit. The identification process may also identify the function(s) that were to be provided by the defective function block.

For the embodiments, in query block 550, whether the number of defective function blocks for a given function is less than the redundant function blocks available to replace the function block may be determined, e.g., by the sequencer/controller. If there are too may defective function blocks, the circuit may be declared defective in block 560, e.g., by the sequencer/controller, and a power off state 565 may be initiated, e.g., by the sequencer/controller. Otherwise in query block 570, whether the defect is repaired by the substitution of available redundant function blocks, may be determined, e.g., by the sequencer/controller. If not, the circuit may be declared defective in block 560, e.g., by the sequencer/controller, and a power off state 565 may be initiated, e.g., by the sequencer/controller. If repair can be effectuated, in block 580 the defective components may be replaced, e.g., by the sequencer/controller, and the circuit may be enabled to continue normal operation in block 590 after receiving an application level resume sequence, e.g., by the sequencer/controller, until a user initiated test is detected in query block 595. The application level resume sequence is designed to ensure that no harm would result from invalid data, if any, outputted from a defective function, because a defective function may have been running for some time before it was identified as defective and possibly enabled data corruption of the application state during the undetected time period. Exemplary application level resume sequences include, for example, a reboot, a resume to the last checkpoint, or any action that ensures that no harm is caused by invalid data, if any.

Although specific embodiments have been illustrated and described herein, it will be appreciated by those of ordinary skill in the art and others, that a wide variety of alternate and/or equivalent implementations may be substituted for the specific embodiment shown in the described without departing from the scope of the present invention. This application is intended to cover any adaptations or variations of the embodiment discussed herein. Therefore, it is manifested and intended that the invention be limited only by the claims and the equivalence thereof.

What is claimed is:

1. A circuit comprising:
   a plurality of input/output (I/O) terminals;
   a plurality of primary function blocks coupled with the I/O terminals, each of the primary function blocks adapted to implement a function, and having built-in self-test (BIST) circuitry adapted to determine whether the primary function block hosting the BIST circuitry is defective or not;
   at least one redundant function block coupled with the I/O terminals, and configurable to replace any defective one of at least a subset of the primary function blocks, and implement the function of the defective primary function block, in place of the defective primary function, the union of the subset of the primary function blocks that each redundant function block can replace being the whole set of primary function blocks;
   a rerouting coupler coupling the primary and redundant function blocks with the terminals, and configurable to reroute I/O and internal signals propagating from one function block to another to facilitate any replacement of a primary function block by a redundant function block; and
   a sequencer coupled to the primary and redundant function blocks, and adapted to determine one or more amount of time to run the BIST inside the function blocks, receive results of the BIST runs, determine at the end of the run(s) which primary function block, if any, is to be replaced by a redundant function block, including which redundant function block or blocks are to be used, and/or provide reconfiguration information to the rerouting coupler to reroute the I/O and internal signals to assist in effectuating the replacement of any defective one of the primary function blocks, if any, by the at least one redundant function block.

2. The circuit of claim 1, wherein there is a single redundant function block.

3. A method comprising:
   running a production test to test a circuit of claim 2; and
   accepting the circuit for distribution only if at most one defective function block is detected, to allow post-distribution performance of an operational process that includes
   the sequencer of the circuit operating the BIST of the circuit on all primary and redundant function blocks of the circuit and instructing the rerouting coupler to reroute I/O and internal signals of the circuit to facilitate a replacement of a defective primary function block, if any, by the redundant function block, or declaring the circuit defective if there is more than one defective primary function block, each time after distribution the circuit is supplied with power and/or upon an explicit external request.

4. A method comprising:
   running a production test to test a circuit of claim 2; and
   accepting for distribution only if the circuit has no defective function block, to allow a post-distribution operational process that includes
   the sequencer of the circuit operating the BIST of the circuit on all primary and redundant function blocks of the circuit, and instructing the rerouting coupler to reroute some of the I/O and internal signals of the circuit to facilitate replacement of a defective primary function block of the circuit, if one exists, by the redundant function block of the circuit, or declaring the circuit to be defective, each time after distribution the circuit is supplied with power and/or upon an explicit external request.

5. The method of claim 4, wherein the circuit further comprises a persistent storage location, the method further comprises storing an identification of a defective primary function block detected during the production test in a persistent storage location of the circuit, and the post-distribution operational process further includes the identified primary function block being considered defective independent of the results of operating the BIST of the circuit, during a performance of the post-distribution operational process.

6. The method of claim 5, wherein the post-distribution operational process further comprises the circuit reporting on one or more of the I/O terminals whether or not a defective function block has been identified yet.

7. The method of claim 4, the post-distribution operational process further comprises the circuit reporting on one or more I/O terminals whether or not a defective function block has been identified yet.

8. The circuit of claim 1, wherein the functions implemented by the primary function blocks are identical, and the primary function blocks and the redundant function blocks are all identical.

9. The circuit of claim 1, wherein the functions implemented by the primary function blocks comprise at least two functions, at least one of the primary function blocks is different from the other primary function blocks, and the redundant function blocks are configurable to selectively implement a different one of the at least two functions at different points in time.

10. The circuit of claim 1, wherein at least one of the primary function blocks is a reconfigurable function block reconfigurable to implement different combinational logic.

11. The circuit of claim 1, wherein at least one of the primary function blocks is a memory block.

12. The circuit of claim 1, wherein the sequencer is adapted to start an auto-diagnostic and repair cycle responsive to a signal received from a source external to the circuit.

13. The circuit of claim 1, wherein the sequencer is adapted to start an auto-diagnostic and repair cycle responsive to application of power to the circuit.

14. The circuit of claim 1 further comprising a persistent storage coupled with the sequencer to persistently store an identification of one or more defective primary function blocks, if any.

15. A method comprising:

running a production test to test a circuit of claim 1; and accepting for distribution the tested circuit, only if the production testing shows the tested circuit as having a ratio of non defective primary function blocks to the at least one redundant function block that allows the sequencer of the circuit to operate BIST of the circuit on all primary and redundant function blocks of the circuit, and instruct the rerouting coupler of the circuit to reroute I/O and internal signals of the circuit to facilitate replacement of any defective one of the primary function blocks of the circuit by the at least one redundant function block of the circuit, if possible, or declare the circuit to be defective, each time after distribution the circuit is supplied with power and/or upon an explicit external request.

16. A method comprising:

running a production test to test a circuit of claim 1; and accepting for distribution the tested circuit, only if N1 non defective primary function blocks of the circuit becoming defective after distribution, N1 being a non-zero positive integer, can be replaced by a number of redundant function blocks of the circuit by a post-distribution operational process that includes the sequencer of the circuit to operate BIST of the circuit on all primary and redundant function blocks of the circuit, and instruct the rerouting coupler of the circuit to reroute I/O and internal signals to facilitate any of the replacements, or declare the circuit defective, each time after distribution the circuit is supplied with power and/or upon an explicit external request.

17. The method of claim 16, wherein the circuit further comprises a persistent storage location, the method further comprises storing an identification of one or more defective primary or redundant function blocks identified during the production test in the persistent storage location of the circuit, and the post-distribution operational process further comprises the sequencer of the circuit considering defective a function block identified in the persistent storage independent of the results of the operating of the BIST of said function block.

18. The method of claim 17, wherein the post-distribution operational process further comprises the sequencer of the circuit storing an identification of a defective primary or redundant function block identified post-distribution in the persistent storage location of the circuit.

19. The method of claim 17, further comprising the circuit reporting on one or more I/O terminals of the circuit whether or not if N2 non defective primary function blocks become defective post-distribution would imply that the circuit will be found defective upon a performance of the post-distribution operational process, N2 being less than or equal to N1.

20. The method of claim 16, further comprising reporting on one or more I/O terminals whether or not if N2 non-defective primary function blocks become defective post-distribution would imply that the circuit will be found defective upon a performance of the post-distribution operational process, N2 being less than or equal to N1.

* * * * *